US012688994B2

(12) United States Patent　　　　(10) Patent No.:　US 12,688,994 B2
Takahashi et al.　　　　　　　　　(45) Date of Patent:　　　Jul. 21, 2026

(54) STAGE DEVICE, AND CHARGED PARTICLE BEAM DEVICE

(71) Applicant: Hitachi High-Tech Corporation, Tokyo (JP)

(72) Inventors: Motohiro Takahashi, Tokyo (JP); Masaki Mizuochi, Tokyo (JP); Shuichi Nakagawa, Tokyo (JP); Tomotaka Shibazaki, Tokyo (JP); Hironori Ogawa, Tokyo (JP); Takanori Kato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 714 days.

(21) Appl. No.: 17/927,976

(22) PCT Filed: Feb. 22, 2021

(86) PCT No.: PCT/JP2021/006623
§ 371 (c)(1),
(2) Date: Nov. 28, 2022

(87) PCT Pub. No.: WO2021/245998
PCT Pub. Date: Dec. 9, 2021

(65) Prior Publication Data
US 2023/0215684 A1　　Jul. 6, 2023

(30) Foreign Application Priority Data
Jun. 2, 2020　(JP) .................................. 2020-096047

(51) Int. Cl.
*H01J 37/20*　　　(2006.01)
*G01B 11/00*　　　(2006.01)

(52) U.S. Cl.
CPC ............ *H01J 37/20* (2013.01); *G01B 11/002* (2013.01); *H01J 2237/20221* (2013.01); *H01J 2237/24578* (2013.01)

(58) Field of Classification Search
None
See application file for complete search history.

(56) References Cited

U.S. PATENT DOCUMENTS 9,817,208 B1 * 11/2017 Vinnitsky ............... H01J 37/20

FOREIGN PATENT DOCUMENTS

CN　　107101941 A　*　8/2017 ............ G01N 21/59
JP　　H0757676 A　*　3/1995
(Continued)

OTHER PUBLICATIONS

Japanese Office Action issued on Nov. 21, 2023 for Japanese Patent Application No. 2020-096047.
(Continued)

*Primary Examiner* — Andrew Smyth
(74) *Attorney, Agent, or Firm* — Volpe Koenig

(57) ABSTRACT

The present invention provides: a stage device that can suppress bending deformation of a mirror, and that can reduce the positioning error of a stage by reducing the measurement error of the position of the stage; and a charged particle beam device comprising this stage device. The stage device according to the present invention comprises: a table (105) on which a sample (106) is placed; a bar mirror (111) installed on the table (105); a laser interferometer (104) that irradiates the bar mirror (111) with laser light and receives reflected light from the bar mirror (111), thereby measuring the position of the table (105); a drive mechanism (103) that moves the table (105); and a plurality of elastic members (203) installed between the bar mirror (111) and the table (105).

20 Claims, 11 Drawing Sheets

(56)            References Cited

FOREIGN PATENT DOCUMENTS

| JP | H08-329873 | A |   | 12/1996 |        |              |
| JP | H09-243316 | A |   | 9/1997  |        |              |
| JP | 3428808    | B2 | * | 7/2003 | ........ | G03F 7/70775 |
| JP | 2006-066733 | A |   | 3/2006  |        |              |
| JP | 2013229530 | A | * | 11/2013 |        |              |
| JP | 2015-018978 | A |   | 1/2015  |        |              |

OTHER PUBLICATIONS

International Search Report, Application No. PCT/JP2021/006623, dated Apr. 20, 2021. 2pages.

* cited by examiner

[FIG. 1]
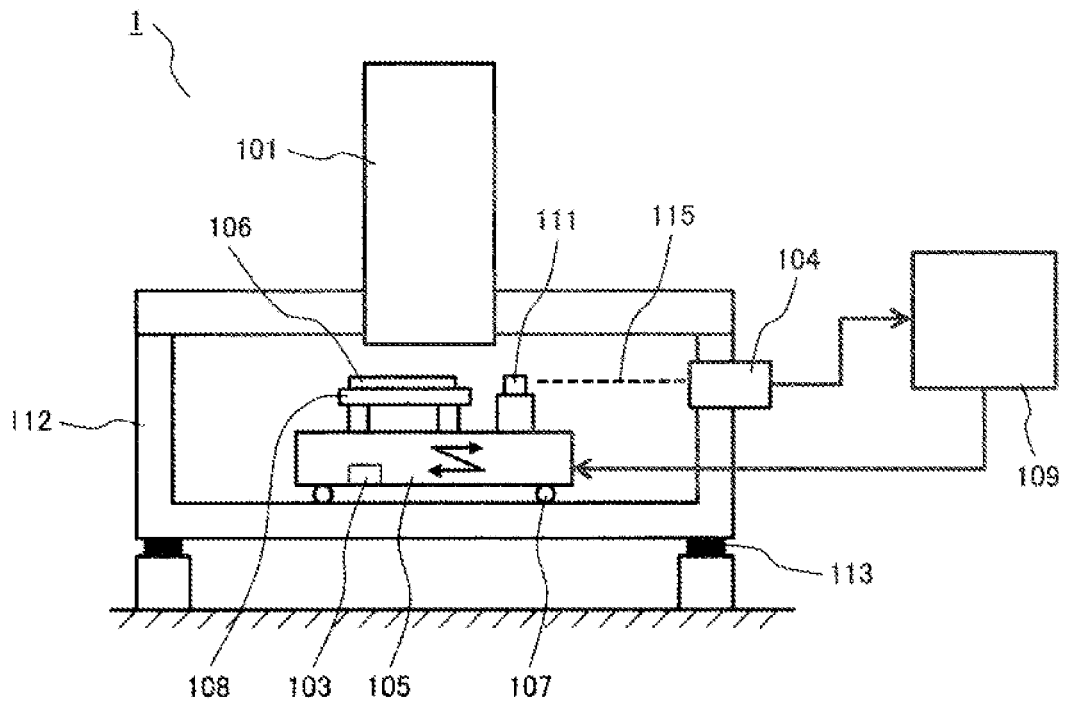
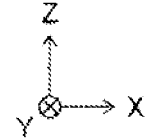
[FIG. 2A]
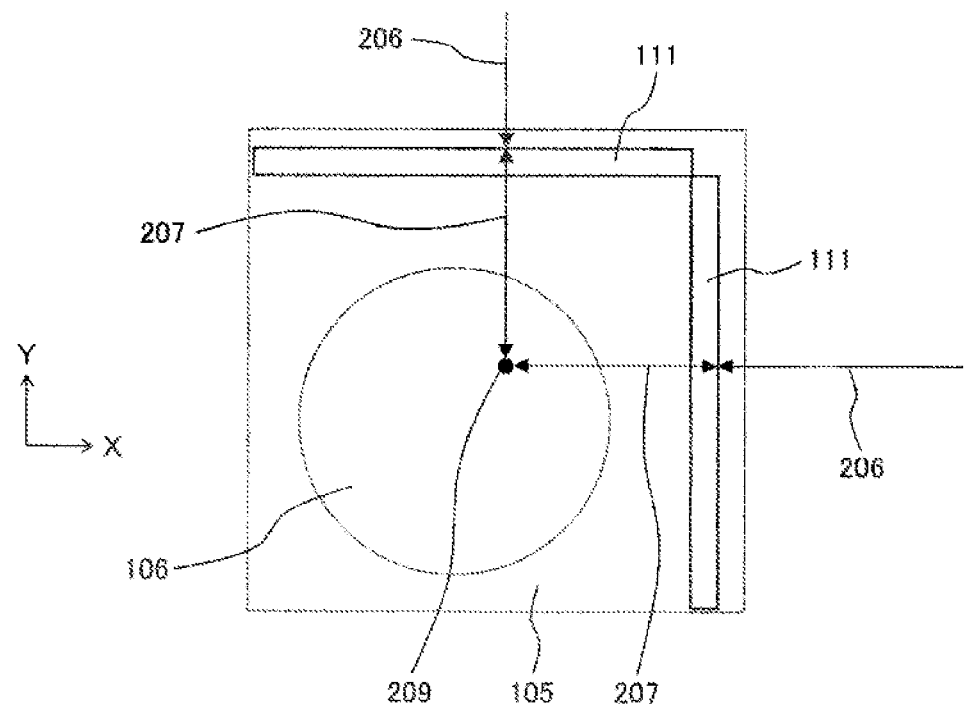

[FIG. 2B]
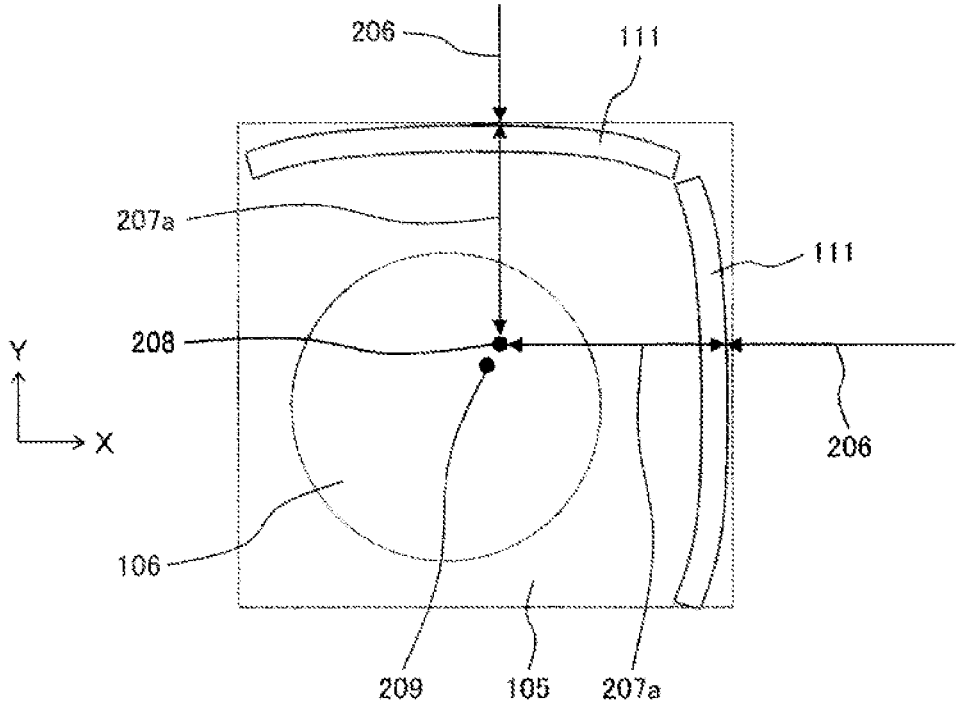
[FIG. 3]
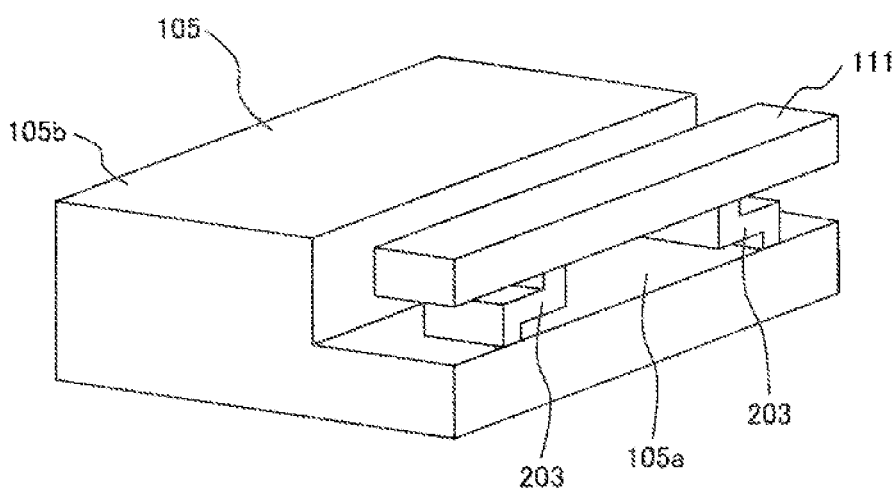

[FIG. 4A]
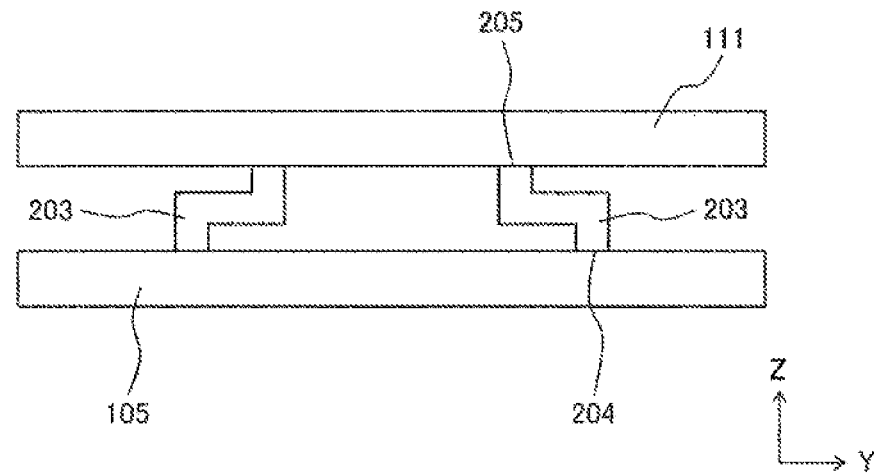
[FIG. 4B]
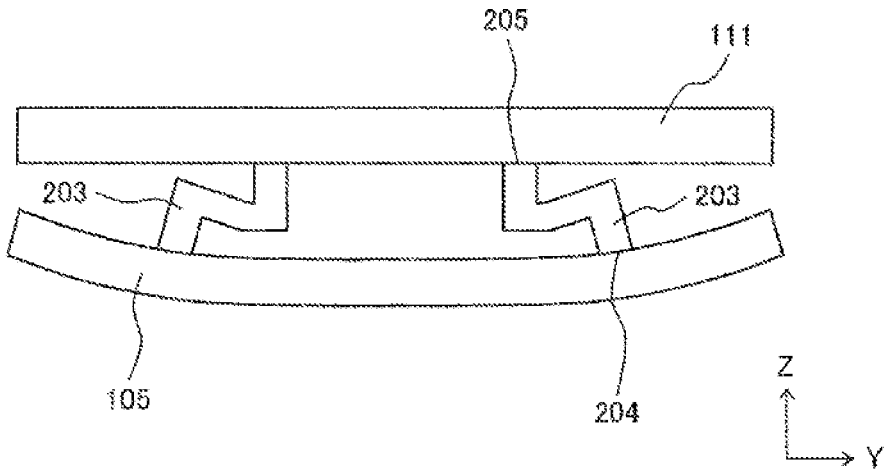

[FIG. 5A]
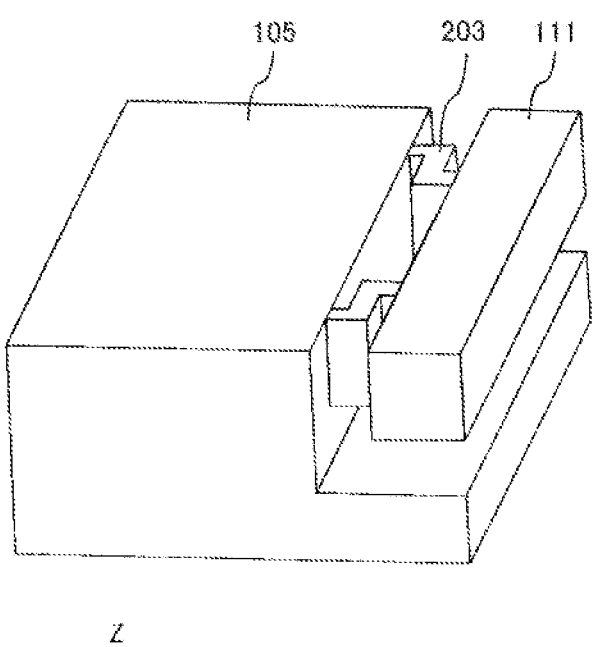
[FIG. 5B]
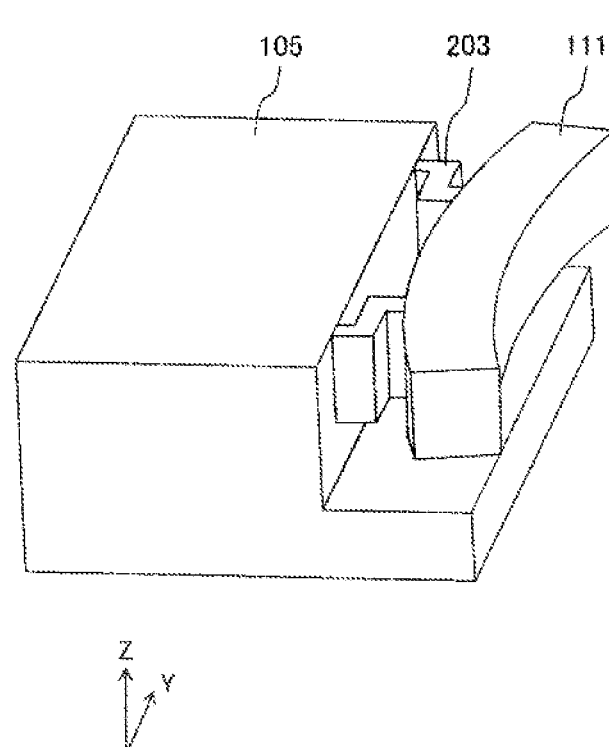

[FIG. 5C]
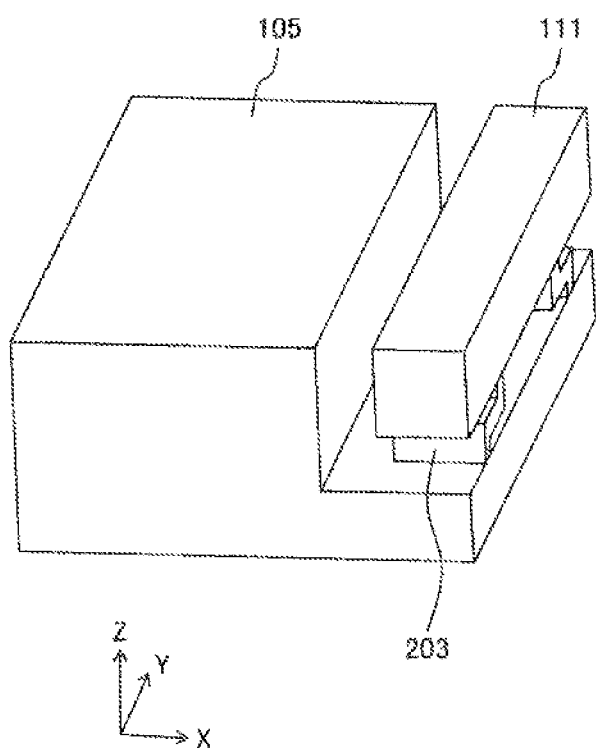
[FIG. 5D]
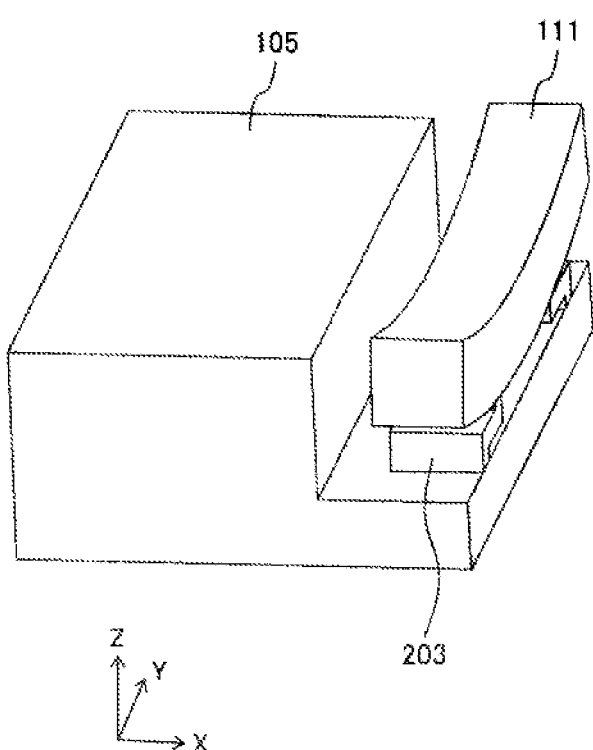

[FIG. 6A]
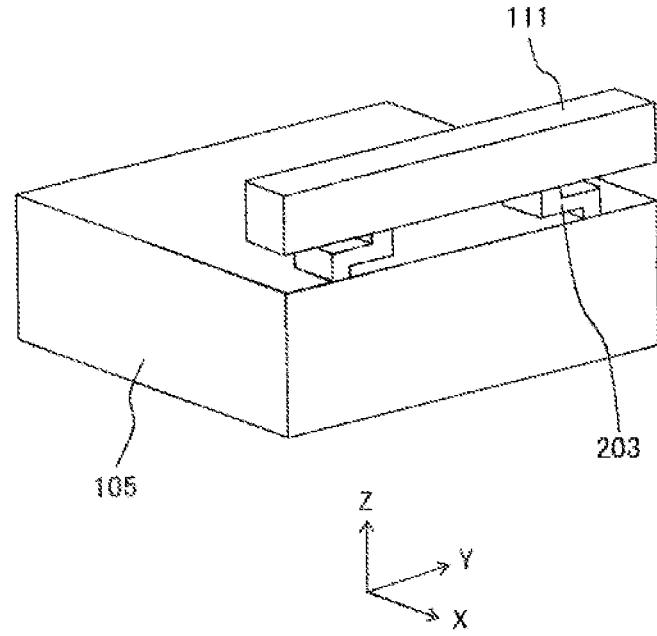
[FIG. 6B]
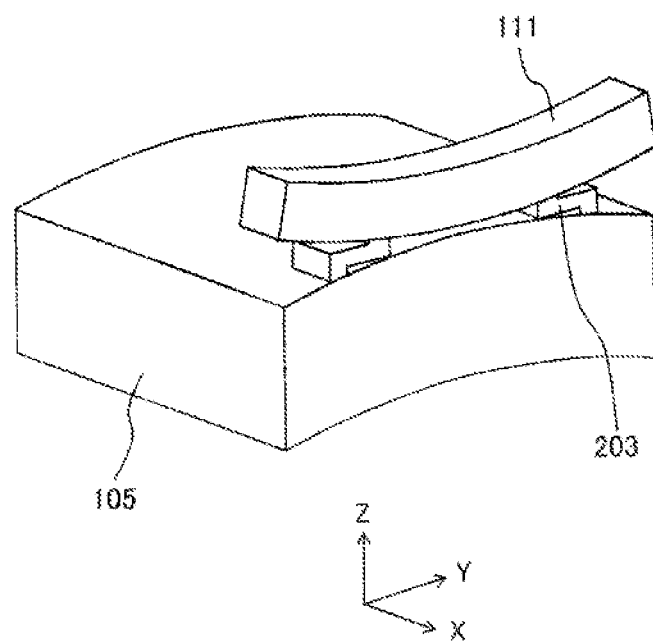

[FIG. 6C]
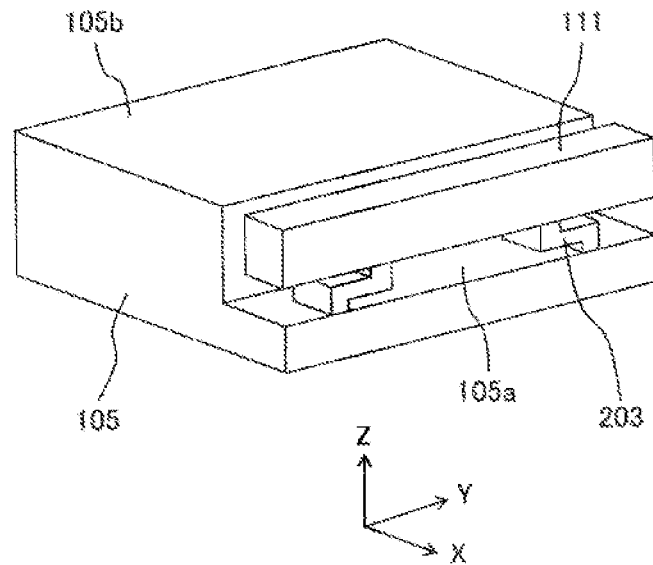
[FIG. 6D]
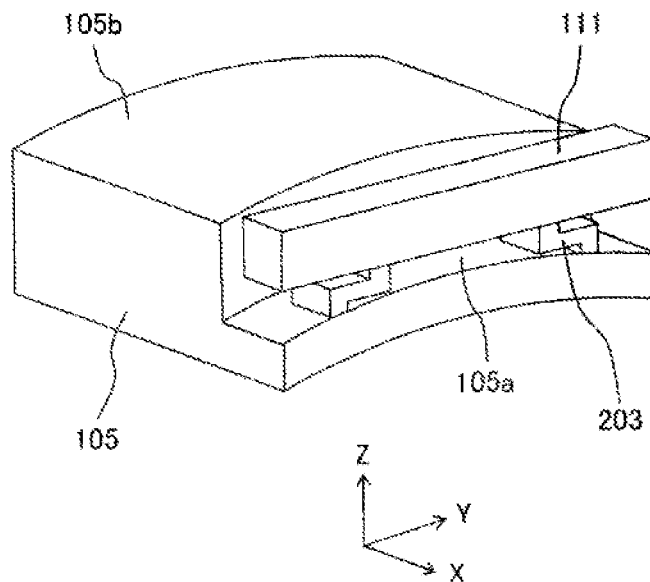

[FIG. 7]
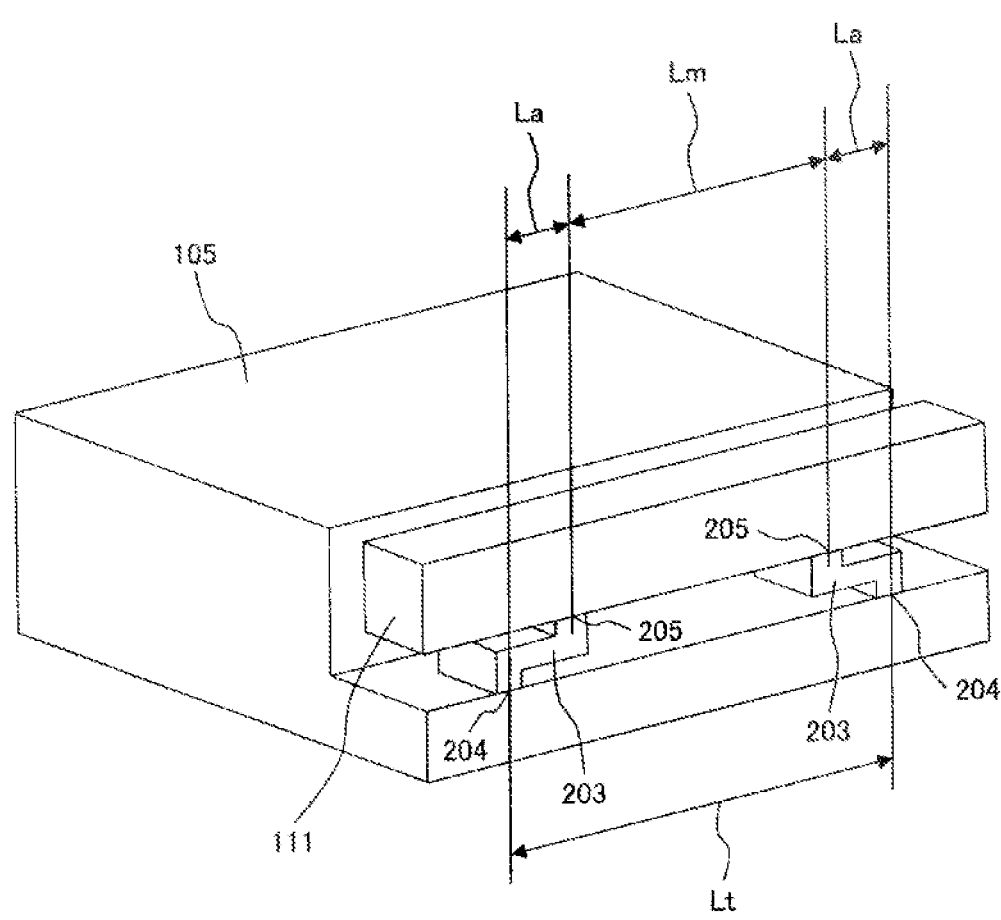
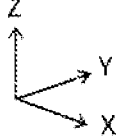

[FIG. 8A]
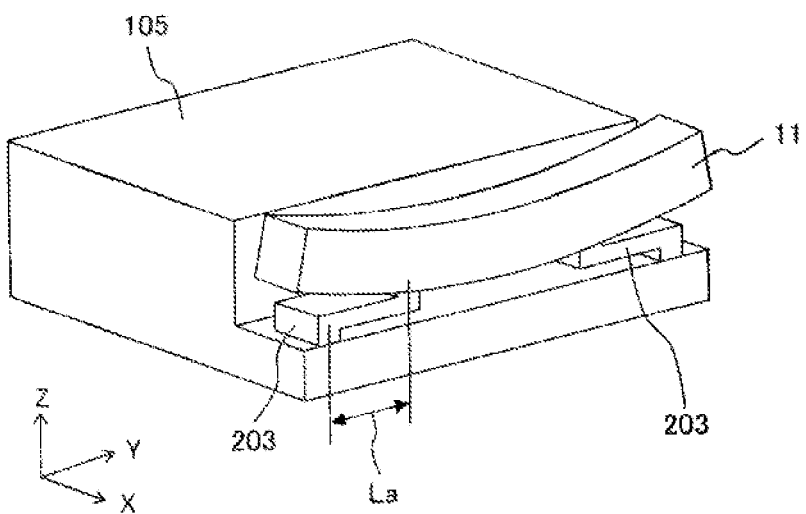
[FIG. 8B]
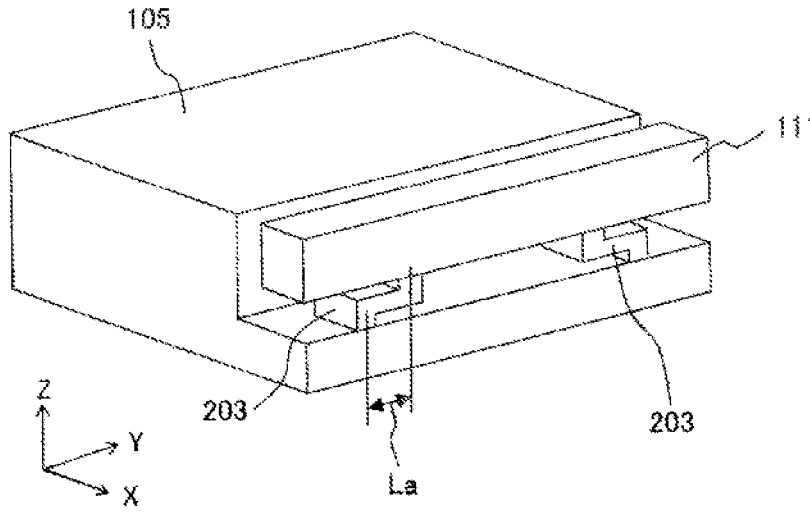

[FIG. 9]
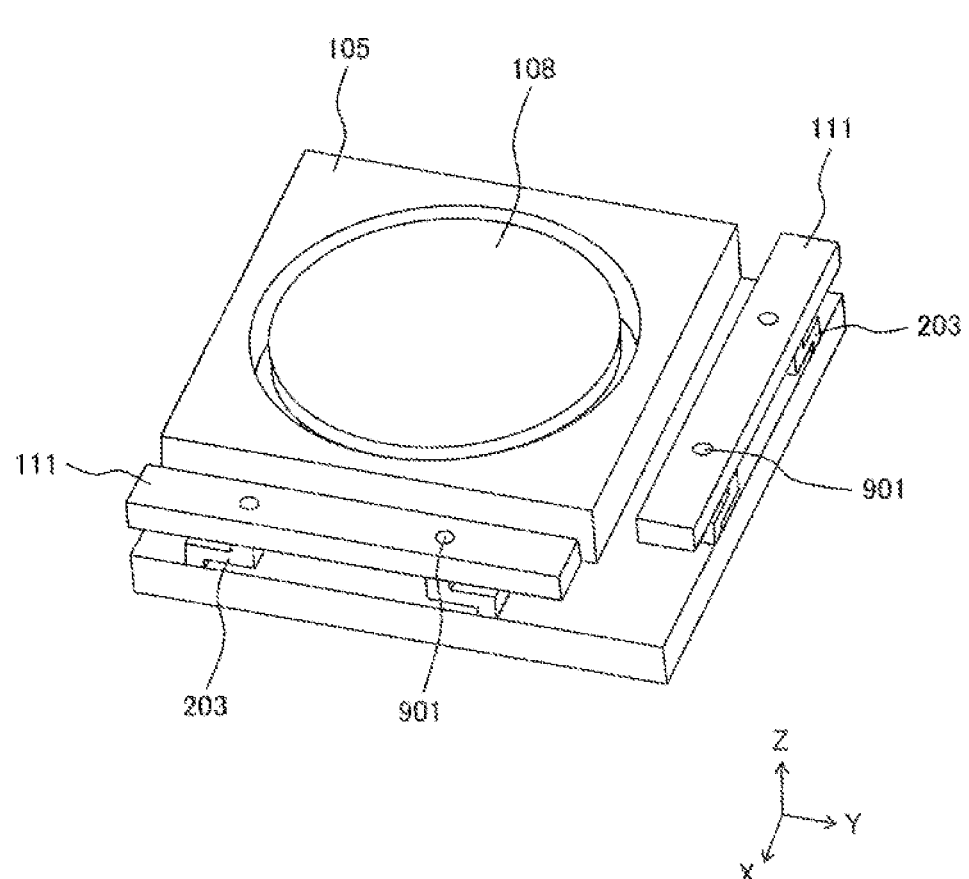

[FIG. 10A]
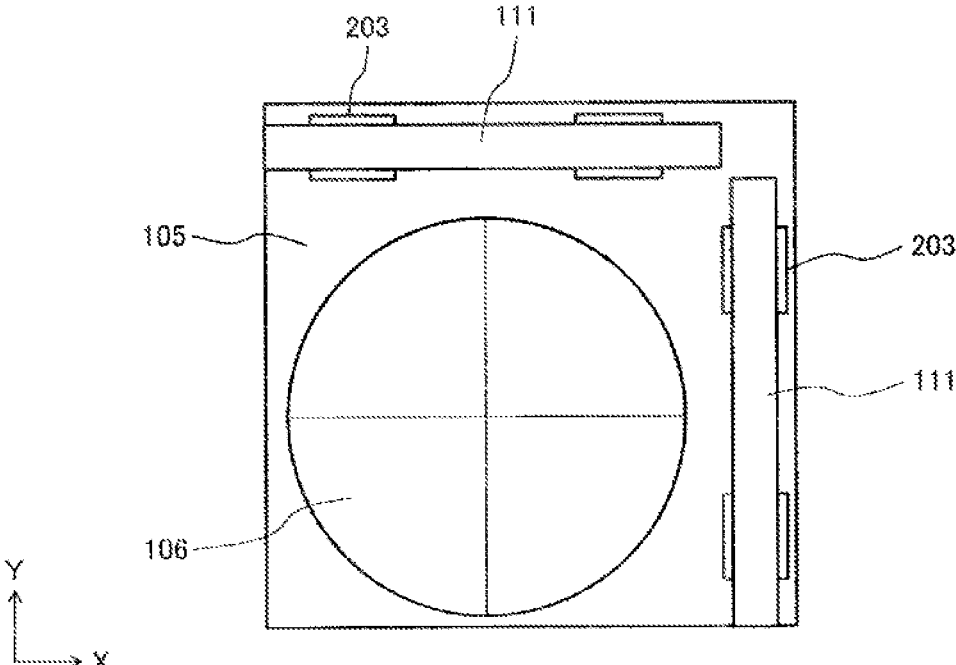
[FIG. 10B]
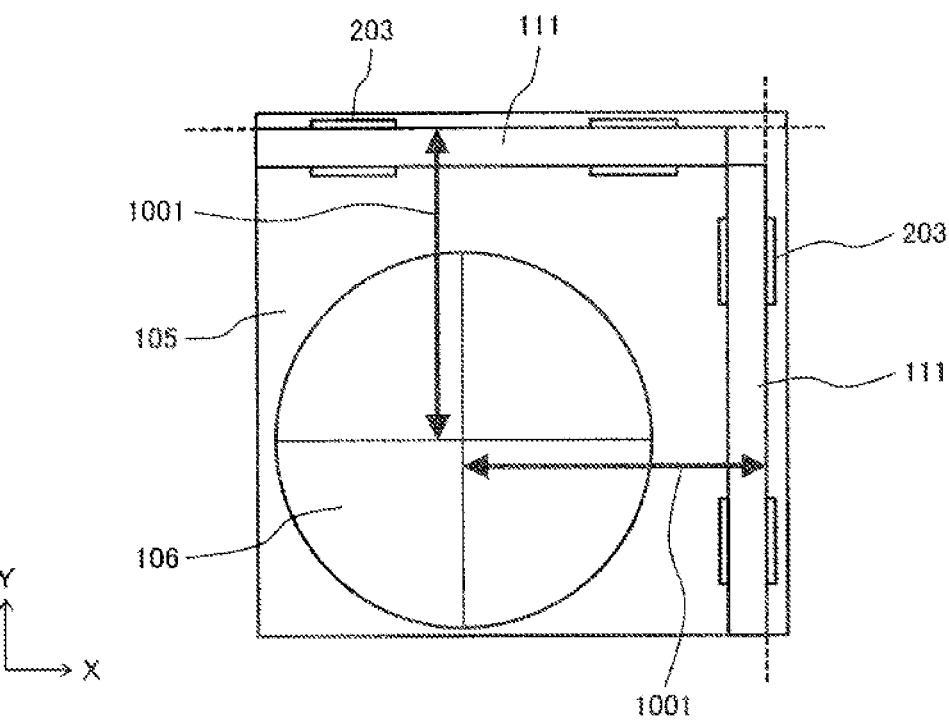

STAGE DEVICE, AND CHARGED PARTICLE BEAM DEVICE

TECHNICAL FIELD

The present invention relates to a stage device that moves a sample and a charged particle beam device provided with the stage device.

BACKGROUND ART

A charged particle beam device such as an electron microscope and the like used for manufacturing, measuring, inspecting semiconductor wafers or the like includes a stage that moves the position of a sample in order to irradiate the sample with a beam at a desired position. Such a stage includes a drive mechanism for moving the sample in at least two directions to move the sample in two dimensions. A laser interferometer is generally used for measuring the position of the stage.

JP-A-9-243316 (PTL 1) discloses a stage device in which ceramic is used for a bar mirror and the mirror is supported by a spring. More specifically, in the movable stage device described in PTL 1, the self-weight of the mirror is supported by a three-point support seat provided on the stage, and by reducing the number of contact portions between the mirror and the stage, transmission of bending deformation of the stage to the mirror can be suppressed. In addition, in order to suppress the bending deformation of the mirror due to the difference in linear expansion coefficient between the mirror and the stage, the mirror can be supported by a spring and the contact portion between the mirror and the stage can be slid, thereby avoiding the force applied to the mirror. With such a configuration, it is possible to suppress the bending deformation of the mirror and reduce the measurement err or of the position of the stage.

CITATION LIST

Patent Literature

PTL 1: JP-A-9-243316

SUMMARY OF INVENTION

Technical Problem

In related stage device such as the movable stage device described in PTL 1 and the like, bending deformation of the mirror caused by deformation of the table on which the sample is placed, and bending deformation of the mirror due to the difference in linear expansion coefficient between the table and the mirror can be suppressed to some extent.

However, in the related stage device, since the table and the mirror are fixed in direct contact with each other, even a small contact area therebetween may transmit the force from the table to the mirror and the mirror may be deformed. Specifically, when slip occurs in the contact portion due to a difference in linear expansion coefficient between the table and the mirror, frictional force always acts on these contact surfaces, and this frictional force causes bending deformation in the mirror. Furthermore, the mirror undergoes different bending deformations according to temperature changes. Since such bending deformation has a large individual difference depending on the mirror and is changed according to a change in the surface state of the mirror, correction is difficult. For this reason, the related stage device has problems in accurately measuring the position of the stage (position of the table), and it is difficult to ensure stable performance during mass production, and long-term stability.

An object of the present invention is to provide a stage device that can suppress bending deformation of a mirror, and that can reduce the positioning error of a stage by reducing the measurement error of the position of the stage, and a charged particle beam device comprising this stage device.

Solution to Problem

The stage device according to the present invention includes a table on which a sample is placed, a bar mirror installed on the table, a laser interferometer that irradiates the bar mirror with laser light and receives reflected light from the bar mirror, thereby measuring a position of the table, a drive mechanism that moves the table, and a plurality of elastic members installed between the bar mirror and the table.

A charged particle beam device according to the present invention includes a sample chamber in which a sample is placed, a lens barrel through which the sample is irradiated with a charged particle beam, and a stage device that moves the sample, in which the stage device is a stage device according to the invention.

Advantageous Effects of Invention

According to the present invention, it is possible to provide a stage device that can suppress bending deformation of a mirror, and that can reduce the positioning error of a stage by reducing the measurement error of the position of the stage, and a charged particle beam device comprising this stage device.

BRIEF DESCRIPTION OF DRAWINGS

FIG. 1 is a diagram illustrating a configuration of a charged particle beam device according to a first embodiment of the present invention.

FIG. 2A is a diagram illustrating a table viewed directly from above, which illustrates a state in which an observation point on a wafer is irradiated with an electron beam.

FIG. 2B is a diagram illustrating the table viewed directly from above, which illustrates a state in which bending deformation occurs in a mirror.

FIG. 3 is a perspective view of the mirror installed on the table in a stage device according to a first embodiment of the present invention.

FIG. 4A is a diagram illustrating a bar mirror installed on the table when viewed along an X direction.

FIG. 4B is a diagram illustrating the bar mirror installed on the table when viewed along the X direction, which illustrates a state in which the table is deformed and warped in a vertical direction.

FIG. 5A is a reference diagram illustrating a configuration in which side surfaces of the bar mirror are fixed to the table with elastic blocks interposed therebetween.

FIG. 5B is a reference diagram illustrating a state in which the interval between the elastic blocks in the Y direction is increased as the table is thermally expanded in the Y direction in the configuration illustrated in FIG. 5A.

FIG. 5C is a diagram illustrating a configuration in which only a lower surface of the bar mirror is fixed to the table with the elastic blocks interposed therebetween in the first embodiment of the present invention.

FIG. 5D is a diagram illustrating a state in which the table is thermally expanded in the Y direction in the configuration illustrated in FIG. 5C.

FIG. 6A is a reference diagram illustrating a configuration in which the elastic blocks are installed on an upper surface of the table without steps, and a bar mirror is fixed to these elastic blocks.

FIG. 6B is a reference diagram illustrating a state in which the table is elastically deformed and warped in a Z direction and the interval of the elastic blocks in the Y direction is changed in the configuration illustrated in FIG. 6A.

FIG. 6C is a diagram illustrating a configuration in which the table has two steps, and the elastic blocks are provided on an upper surface of a lower step, and the bar mirror is fixed to the elastic blocks in the first embodiment of the present invention.

FIG. 6D is a diagram illustrating a state in which the table is elastically deformed and warped in the Z direction in the configuration illustrated in FIG. 6C.

FIG. 7 is a perspective view of a bar mirror installed on a table in a stage device according to a second embodiment of the present invention.

FIG. 8A is a perspective view of a configuration in which a bar mirror made of glass is installed on the table.

FIG. 8B is a perspective view of a configuration in which a bar mirror made of ceramics, metal, or a composite material, of the metal and ceramics is installed on a table in a stage device according to a third embodiment of the present invention.

FIG. 9 is a perspective view of a part of the stage device according to the third embodiment of the present invention.

FIG. 10A is a diagram illustrating a table before thermal expansion viewed directly from above, in the third embodiment of the present invention.

FIG. 10B is a diagram illustrating the table thermally expanded due to temperature change viewed directly from above, in the third embodiment of the present invention.

DESCRIPTION OF EMBODIMENTS

For a charged particle beam device such as an electron microscope and the like, the miniaturization of a semiconductor device gives rise to a demand for high accuracy in sample positioning in not only the semiconductor manufacturing apparatuses, but also the inspection devices and measuring devices. In order to measure a pattern at a desired position on a wafer, which is a sample, the position of the wafer is moved by the stage to position a desired measurement position on the wafer at an irradiation position of the electron beam, and an image (e.g., SEM image) of the pattern on the wafer is obtained. At this time, even when there is a positioning error in the stage, if the amount of the positional deviation from the desired measurement position of the wafer (the distance between the desired measurement position and the electron beam irradiation position) can be accurately measured, by deflecting the electron beam, the stage positioning error can be corrected, and the pattern can be, measured at the desired measurement position. However, if the amount of the positional deviation from the desired measurement position of the wafer cannot be accurately measured, there occurs an error in the deflection of the electron beam and accordingly, the electron beam cannot be irradiated to the desired measurement position, resulting in a deviation in the field of view.

This deviation in the field of view occurring as described above, that is, the distance between the desired measurement position and the irradiation position of the electron beam irradiated after correcting the positioning error of the stage is called the field of view positioning error. When the field of view positioning error occurs, it is difficult to irradiate a desired measurement position with an electron beam and to measure (inspect) the pattern at the desired position, especially in a wafer having a fine pattern.

A charged particle beam device uses a laser interferometer equipped with a mirror such as a bar mirror and the like to measure the position of the stage. The positioning error caused by processing during manufacturing of the mirror or elastic deformation during fixation or the like, which is reproducible, can be corrected using a correction map prepared in advance. The reproducible positioning error is an error that occurs with the same magnitude for each measurement. The correction map stores the amount of positional deviation of the measurement position (amount of deviation of the image) for each coordinate of the wafer, and the characteristics of the amount of positional deviation of the device are recorded therein.

However, if the mirror is deformed after the correction map is created, the deviation (image deviation) of the measurement position due to this deformation cannot be corrected, resulting in a field of view positioning error. In order to reduce the field of view positioning error, it is important to reduce non-reproducible positioning errors. The non-reproducible positioning error is an error with a magnitude that can vary from one measurement to another, such as a deviation of the measurement position caused by bending deformation of the mirror, or the like.

Examples of the bending deformation of the mirror that causes the non-reproducible positioning error include bending deformation of the mirror caused by distortion of the table on which the sample (wafer) is placed, bending deformation of the mirror caused by thermal deformation of the table, and bending deformation of the mirror caused by the difference in linear expansion coefficients between the table and the mirror. These bending deformations of mirrors cause non-reproducible positioning errors and field of view positioning errors that cannot be corrected with the correction map.

With the stage device according to the present invention, it is possible to suppress the bending deformation of the mirror, reduce the measurement error of the position of the stage (the position of the table) to reduce the positioning error of the stage, and reduce the field of view positioning error.

Hereinafter, a stage device and a charged particle beam device according to embodiments of the present invention will be described. In the following embodiments, a critical dimension scanning electron microscope (SEM) will be described as an example of the charged particle beam device. The critical dimension SEM is a semiconductor measuring device that irradiates a sample with an electron beam which is a charged particle beam. In addition, as a sample to be irradiated with the charged particle beam, a wafer having a circuit pattern such as a semiconductor element and the like will be described as an example. In the drawings used in this specification, the same or corresponding components are denoted by the same reference numerals, and repeated description of these components may be omitted.

First Embodiment

<Configuration Example of Charged Particle Beam Device>

FIG. 1 is a diagram illustrating the configuration of a charged particle beam device 1 according to a first embodiment of the present invention. The charged particle beam device 1 is a critical dimension SEM that irradiates a wafer 106 as a sample with an electron beam to capture an image of a pattern on the wafer 106, hereby measuring the linewidth of the pattern and evaluating the shape thereof. The charged particle beam device 1 includes a sample chamber 112, an electron optical system lens barrel 101 installed in the sample chamber 112, and a stage device that moves the wafer 106. The sample chamber 112 is supported on an anti-vibration mount 113, and includes the wafer 106 disposed therein. The electron optical system lens barrel 101 irradiates the wafer 106 with an electron beam.

The stage device includes a table 105, a drive mechanism 103, a mirror 111, a laser interferometer 104, and a controller 109. The stage device moves the wafer 106 in two-dimensional directions in the horizontal plane, that is, in the X direction, which is an arbitrary direction in the horizontal plane, and in the Y direction, which is orthogonal to the X direction in the horizontal plane. Such a stage device is called an X-Y stage. In addition, a direction orthogonal to the X direction and the Y direction (the length direction of the electron optical system lens barrel 101) is defined as a Z direction.

The table 105 is supported on guides 107 and installed in the sample chamber 112, has the wafer 105 placed thereon, and is moved the drive mechanism 103. The table 105 includes a chuck 108 on which the wafer 105 is placed. For example, the table 105 includes a Y table movable in the Y direction and an X table installed on the Y table and movable in the X direction.

The drive mechanism 103 a mechanism for moving the table 105, and includes a linear motor, a piezo actuator, and the like, for example. When the table 105 has the X table and the Y table, the drive mechanism 103 has a drive mechanism (first drive mechanism) for moving the X table in the X direction, and a drive mechanism (second drive mechanism) for moving the Y table in the Y direction.

The mirror 111 is a bar mirror and installed on the table 105.

The laser interferometer 104 irradiates the mirror 111 with laser light and receives reflected light from the mirror 111 to measure the position of the mirror 111 and the position of the table 105. FIG. 1 depicts an optical axis 115 of the laser interferometer 104.

The controller 109 obtains the position of the table 105 measured by the laser in 104 as stage coordinates. The controller 109 controls the position of the table 105 by transmitting signals to the drive mechanism 103 to move the table 105.

If the captured image has a reproducible positioning error, the charged particle beam device 1 records the amount of deviation of the image with respect to the coordinates of the wafer 106 to create a correction map, thereby correcting the stage positioning error and correcting the deviation of the image (deviation of the measurement position). For example, by adding the amount of deviation of the image obtained from the correction map to the difference between the measured position of the table 105 and the target position of the table 105, and shifting the electron beam by the amount obtained as a result, the reproducible positioning error can be reduced to a value close to zero.

However, even when the correction is performed using the correction map, a stage positioning error may remain. This positioning error (field of view positioning error) needs to be reduced as much as possible, especially when measuring a device with a pattern interval of several nanometers. For example, the field of view positioning error is caused by the bending deformation of the mirror 111.

<Relationship Between Mirror Bending Deformation and Field of View Positioning Error>

FIGS. 2A and 2B are schematic views for explaining that the field of view positioning error occurs due to bending deformation of the mirror 111, and are views of the table 105 viewed directly from above.

FIG. 2A illustrates a state in which the mirror 111 as a bar mirror and the wafer 106 as a sample are placed on the table 105 and an observation point 209 on the wafer 106 is irradiated with an electron beam. Two mirrors 111 are installed on the table 105, that is, the mirror 111 is extended in the X direction and the mirror 111 is extended in the Y direction. The mirror 111 extending in the X direction is used to measure the distance in the Y direction, and the mirror 111 extending in the Y direction is used to measure the distance in the X direction.

The laser interferometer 104 measures, for the two mirrors 111, distances 206 of the reflection surfaces of the mirrors 111 from a reference point. The reference point is the position of the laser interferometer 104 or the position of the electron optical system lens barrel 101, for example. The intersection of the optical axis of the laser interferometer in the X direction and the optical axis of the laser interferometer in the Y direction always coincides with the observation point 209. If distances 207 between the reflection surfaces of the mirrors 111 and the observation point 209 are constant, the position of the observation point 209 can be accurately measured by adding the distances 207 the distances 206 measured by the laser interferometer 104. The distances 207 are recorded for each coordinate of the wafer 106 and stored in the correction map.

FIG. 2B illustrates a state in which bending deformation occurs in the mirrors 111 in the state (FIG. 2A) in which the observation point 209 on the wafer 105 is irradiated with the electron beam. It is assumed that this deformation of the mirror 111 is occurred after the correction map is created (that is, after the distances 207 in FIG. 2A are stored in the correction map). The deformation of the mirror 111 changes the distances between the mirror 111 and the observation point 209 in the X and Y directions. That is, when the mirror 111 is deformed, the distance between the mirror 111 and the observation point 209 is obtained as a distance 207a illustrated in FIG. 2B.

Therefore, by correcting the positioning error using the correction map, an observation point 208 illustrated in FIG. 2B is obtained as the observation point. Since the observation point 208 obtained by the correction map after the deformation of the mirror 111 is different in position from the observation point 209 obtained before the deformation of the mirror 111, a field of view deviation occurs. The position difference (amount of deviation of the image) between the observation point 208 and the observation point 209 is the field of view positioning error.

As described above, when bending deformation occurs in the mirror 111, the distance 207 between the mirror 111 and the desired observation point 209 is changed, and the desired measurement position (the observation point 209) cannot be irradiated with the electron beam and the field of view positioning error occurs.

<Support Structure of Mirror in Stage Device According to Present Embodiment>

A stage device according to the first embodiment of the present invention will be described. The stage device according to the present embodiment is characterized by a support structure of the mirror 111.

FIG. 3 is a diagram illustrating the support structure of the mirror 111 provided in the stage device according to the present embodiment, which is a perspective view of the mirror 111 installed on the table 105. The mirror 111 is a bar mirror that is extended in one direction. In the following description, the mirror 111 is also called a bar mirror 111, and the bar mirror 111 extending in the Y direction will be described as an example. The bar mirror 111 extending in the X direction can also be supported by the same structure as the bar mirror 111 extending in the Y direction.

The stage device according to the present embodiment has at least one of the following four features as the support structure for the bar mirror 111.

A first feature is that the stage device includes a plurality of elastic members 203 between the table 105 and the bar mirror 111. That is, the plurality of elastic members 203 are installed on the table 105 and the bar mirrors 111 are installed on the plurality of elastic members 203. The elastic members 203 are fixed to the bar mirror 111 and the table 105. The elastic member 203 is preferably made of a block-shaped elastic material having good heat conductivity. For example, the elastic member 203 can be mage of an aluminum alloy. The elastic member 203 may have any shape.

Hereinafter, it is assumed that the elastic member 203 is made of a block-shaped elastic material, and the elastic member 203 is called an elastic block 203.

Since the elastic block 203 is installed to be interposed between the bar mirror 111 and the table 105, the deformation and distortion of the table 105 are not directly transmitted to the bar mirror 111, and the bending deformation of the bar mirror 111 can be suppressed.

A second feature is that the position at which the elastic block 203 and the table 105 are fixed to each other and the position at which the elastic block 203 and the bar mirror 111 are fixed to each other are different from each other in the length direction of the bar mirror 111 (that is, in the Y direction). That is, the fixing portion between the elastic block 203 and the table 105 and the fixing portion between the elastic block 203 and the bar mirror 111 are positioned at different positions in the Y direction. Since the position of the fixing portion to the table 105 and the position of the fixing portion to the bar mirror 111 are different from each other in the Y direction, the elastic block 203 can more effectively prevent deformation and distortion of the table 105 from being transmitted to the bar mirror 111.

A third feature is that only a lower surface of the bar mirror 111 is fixed to the table 105 (with the elastic block 203 interposed therebetween). Since only the lower surface of the bar mirror 111 is fixed, even when bending deformation occurs, warping upward and warping in the horizontal direction can be prevented.

A fourth feature is that the table 105 has two portions (that is, two steps 105a, 105b) with different heights (that is, the positions in the Z direction are different from each other), and the elastic blocks 203 are installed on an upper surface of the lower step 105a. Since the bar mirror 111 is fixed to the elastic block 203 provided on the lower step 105a of the table 105, it is possible to reduce the bending deformation occurring in the bar mirror 111 when the table 105 is deformed.

The first and second features will be described with reference to FIGS. 4A and 4B.

FIG. 4A is a diagram illustrating the bar mirror 111 installed on the table 105, which illustrates the bar mirror

111 viewed along the X direction (the direction orthogonal to the length direction of the bar mirror 111). The bar mirror 111 is installed on a plurality of elastic blocks 203 provided on the table 105. The position of a fixing portion 205 between the elastic block 203 and the bar mirror 111 and the position of a fixing portion 204 between the elastic block 203 and the table 105 are different from each other in the Y direction. The elastic block 203 may have any shape as long as the positions of the fixing portion 205 and the fixing portion 204 are different from each other in the Y direction, and the shape is not limited to the shape illustrated in FIG. 4A.

Like FIG. 4A, FIG. 4B is a diagram illustrating the bar mirror 111 installed on the table 105, which illustrates the bar mirror 111 viewed along the X direction. However, the table 105 is deformed and warped in the vertical direction (Z direction).

When the table 105 is deformed, the elastic block 203 can be deformed, such that bending deformation of the bar mirror 111 can be suppressed. In addition, since the position of the fixing portion 204 between the elastic block 203 and the table 105 and the position of the fixing portion 205 between the elastic block 203 and the bar mirror 111 are different from each other in the Y direction (that is, in length direction of the bar mirror 111), the effect of suppressing bending deformation of the bar mirror 111 is increased. This is because if the positions of the fixing portions 204 and 205 are different from each other in the Y direction, the rigidity between the fixing portions 204 and 205 is lowered and bending deformation is less likely to be transmitted from the fixing portion 204 to the fixing portion 205 and accordingly, the deformation of the table 105 can be suppressed from being transmitted to the bar mirror 111.

The third feature will be described with reference to FIGS. 5A to 5D. FIGS. 5A to 5D are perspective views of the bar mirror 111 installed on the table 105.

FIG. 5A is a reference diagram illustrating a configuration which side surfaces (Y-Z surfaces) of the bar mirror 111 are fixed to the table 105 with the elastic block 203 interposed therebetween. In such a configuration, when the table 105 is thermally expanded in the Y direction, the interval between the elastic blocks 203 in the Y direction is increased.

FIG. 5B is a reference diagram illustrating a state in which the interval between the elastic blocks 203 in the Y direction is increased as the table 105 is thermally expanded in the Y direction in the configuration illustrated in FIG. 5A. When the interval of the elastic blocks 203 in the Y direction is increased, the bar mirror 111 warps in the X direction. Since the distance in the X direction is measured with the laser interferometer 104 (FIGS. 2A and 2B), the warpage of the bar mirror 111 in the X direction causes a field of view positioning error.

FIG. 5C is a diagram illustrating a configuration in which only the lower surface (X-Y plane) of the bar mirror 111 is fixed to the table 105 with the elastic block 203 interposed therebetween according to the present embodiment.

FIG. 5D is a diagram illustrating a state in which the table 105 is thermally expanded in the Y direction in the configuration of the present embodiment illustrated in FIG. 5C. When the table 105 is thermally expanded in the Y direction, the interval between the elastic blocks 203 in the Y direction is increased as in the case illustrated in FIG. 5B. However, the bar mirror 111 warps in the Z direction (vertical direction). Since the warpage of the bar mirror 111 in the Z direction does not directly cause an error in X direction distance measurement by the laser interferometer 104, it is possible to suppress the occurrence of field of view positioning errors (that is, field of view deviation).

As illustrated in FIGS. 3, 5C, and 5D, in the configuration in which the bar mirror 111 is fixed to the table 105 only at the lower surface, since the warpage of the bar mirror 111 is limited to the upward direction (the Z direction), the warpage in the horizontal direction the (e.g., X direction) that causes the field of view deviation can be reduced. Further, in order to suppress warpage in the horizontal direction, it is also desirable that the thickness of the bar mirror 111 in the horizontal direction (e.g., the X direction) is made larger than the thickness in the vertical direction (the Z direction), so that the bar mirror 111 is more likely to warp in the vertical direction.

The fourth feature will be described with reference to FIGS. 6A to 6D. FIGS. 6A to 6D are perspective views of the bar mirror 111 installed on the table 105.

FIG. 6A is a reference diagram illustrating a configuration in which the table 105 does not have steps (positions in the Z direction, that is, the portions with height difference from each other), the elastic blocks 203 are installed on the upper surface of the table 105, and the bar mirror 111 is fixed to the elastic block 203. In such configuration, when the table 105 is elastically deformed so as to warp in the direction, the interval between the elastic blocks 203 in the Y direction is changed.

FIG. 6B is a reference diagram illustrating a state in which the table 105 is elastically deformed and warped in the direction and the interval of the elastic blocks 203 in the Y direction is changed in the configuration illustrated in FIG. 6A. When the table 105 is elastically deformed so as to be warped in the Z direction due to thermal deformation or distortion caused by the rolling elements of the guides 107, the interval of the elastic blocks 203 in the Y direction is changed (in FIG. 6B, the interval is widened). Then, the bar mirror 111 is warped such that the lower surface is widened and the central portion in the length direction is protruded downward. Although the bar mirror 111 is warped in the Z direction, it also undergoes considerable deformation in the X direction, resulting in a field of view positioning error.

FIG. 6C is a diagram illustrating a configuration in which the table 105 has two steps 105a and 105b, the elastic blocks 203 are provided on the upper surface of the lower step 105a, and the bar mirror 111 is fixed to the elastic blocks 203 according to the present embodiment. Since the elastic blocks 203 are provided on the upper surface of the lower step 105a of the table 105, the elastic blocks 203 are installed at the height position of the middle plane of the table 105 or in the vicinity of the height position of this middle plane. The middle plane is a plane in which neither the compressive nor the tensile stress occurs within the table 105.

FIG. 6D is a diagram illustrating a state in which the table 105 is elastically deformed and warped in the Z direction in the configuration of the present embodiment illustrated in FIG. 6C. Since the elastic blocks 203 are installed at the height position of the middle plane of the table 105 or in the vicinity of the height position of this middle plane, compared to when the elastic blocks 203 are installed on the upper surface of the table 105 (FIG. 6B), the deformation of the table 105 is less likely to be transmitted, and the change in the interval in the Y direction is smaller. Therefore, even when the table 105 is deformed so as to warp in the Z direction, no force is applied to the lower surface of the bar mirror 111, and the warpage of the bar mirror 111 in the Z direction can be reduced. Therefore, the deformation of the bar mirror 111 in the X direction can be suppressed, and the occurrence of field of view positioning error (that is, field of view deviation) can be suppressed.

As described with reference to FIGS. 6A to 6D, it is desirable that the elastic block 203 is installed at the height position of the middle plane of the table 105 or in the vicinity of the height position of this middle plane.

As described above, the stage device according to the present embodiment has at least one of the four features described above, can suppress the bending deformation of the bar mirror 111, reduce the measurement error of the position of the table 105 (the measurement error of the position of the stage), and reduce the field of view positioning error which is the stage positioning error.

Second Embodiment

A stage device according to a second embodiment of the present invention will be described. In the first embodiment, it has been described that the plurality of elastic blocks 203 are provided between the bar mirror 111 and the table 105 such that the bending deformation of the bar mirror 111 can be suppressed even when the table 105 is deformed. In the present embodiment, in addition to the above configuration, a configuration will be described in which the dimensions of the elastic block 203 are determined so as to suppress the bending deformation of the bar mirror 111 caused by the difference in thermal expansion between the bar mirror 111 and the table 105.

FIG. 7 is a diagram illustrating the support structure for the bar mirror 111 provided in the stage device according to the present embodiment, which is a perspective view of the bar mirror 111 installed on the table 105. A method for determining the dimensions of the elastic block 203 will be described with reference to FIG. 7.

As illustrated in FIG. 7, in one elastic block 203, La is the distance between the fixing portion 204 between the elastic block 203 and the table 105 and the fixing portion 205 between the elastic block 203 and the bar mirror 111 in the length direction of the bar mirror 111 (that is, the Y direction). Furthermore, in the two adjacent elastic blocks 203, Lt is the interval between the fixing portions 204 and the table 105 in the Y direction. In the two adjacent elastic blocks 203, Lm is the interval between the fixing portions 205 and the bar mirror 111 in the Y direction. The interval Lt is a fixed interval of the table 105 between the two adjacent elastic blocks 203. The interval Lm is a fixed interval of the bar mirrors 111 between the two adjacent elastic blocks 203.

Kt is the linear expansion coefficient of the material forming the table 105, Km is the linear expansion coefficient of the material forming the bar mirror 111, and Ka is the linear expansion coefficient of the material forming the elastic block 203.

The following equation is established from the relationship between the lengths of the bar mirror 111, the table 105, and the elastic block 203 in the Y direction:

$$Lt = Lm + 2La \qquad \text{(Equation 1)}$$

In addition, considering the case where the thermal expansion is balanced among the bar mirror 111, the table 105 and the elastic block 203 and no thermal stress is generated, the following equation is established from the relationship of thermal expansion of these members:

$$Lt \cdot Kt \cdot \Delta T = Lm \cdot Km \cdot \Delta T + 2La \cdot Ka \cdot \Delta T \qquad \text{(Equation 2).}$$

In the above equation, $\Delta T$ represents a temperature change.

From Equations 1 and 2, the following relationship is obtained:

$$Lm(Ka-Kt)/(Ka-Km)\cdot Lt \qquad\qquad \text{(Equation 3)}$$

From Equation 3, when one of the fixed interval Lm of the bar mirror 111 and the fixed interval Lt of the table 105 is determined, the other is determined. Once the fixed intervals Lm and Lt are determined, the distance La of the elastic block 203 between the fixing portion 204 and the fixing portion 205, that is, the length La of the elastic block 203 in the Y direction is obtained from Equation 1.

Note that, if the shape of the elastic block 203 is different from the shape illustrated in FIG. 7, a relationship different from that in Equation 1 may be established for Lt, Lm, and La. In this case, by finding the relationship between Lt, Lm, and La and obtaining equations corresponding to Equations 1 to 3, the dimension of the elastic block 203 (the length La of the elastic block 203 in the Y direction) can be obtained.

In the stage device according to the present embodiment, even when the table 105 and the bar mirror 111 are thermally expanded, by determining the length La of the elastic block 203 in the Y direction as described above, it is possible to balance the thermal expansion and prevent the generation of thermal stress, thereby suppressing the bending deformation of the bar mirror 111.

Third Embodiment

A stage device according to a third embodiment of the present invention will be described. In the third embodiment, a structure that further effectively suppresses thermal deformation of the bar mirror 111 by using ceramics, metal, or a composite material of metal and ceramics as the material of the bar mirror 111 will be described.

FIG. 8A is a perspective view of a configuration in which the bar mirror 111 made of glass is installed on the table 105.

Conventionally, the bar mirror 111 is generally manufactured using glass, and the table 105 is generally manufactured using metal, ceramics, or a composite material of metal and ceramics. Since glass has a small linear expansion coefficient and a small thermal deformation, the glass alone is a suitable material for the members such as the bar mirror 111 and the like that should avoid thermal deformation. However, considering the deformation of the bar mirror 111 caused by the difference in thermal expansion between the bar mirror 111 and the table 105, aspects are not limited thereto.

As illustrated in FIG. 8A, when the material of the bar mirror 111 is glass, since the bar mirror 111 has a smaller coefficient of thermal expansion than the table 105, it deforms so as to warp in the Z direction. Even when the dimension (length La) of the elastic block 203 is determined as described in the second embodiment to suppress the bending deformation of the bar mirror 111, unless the table 105 is made of a material having a linear expansion coefficient similar to that of glass, the length La of the elastic block 203 in the Y direction is increased as the bar mirror 111 is deformed. As a result, since the thermal resistance of the elastic block 203 is increased and the conduction of heat from the table 105 to the bar mirror 111 via the elastic block 203 is hindered, it is difficult to balance the thermal expansion between the bar mirror 111, the table 105 and the elastic block 203 and prevent thermal stress from generating, and as a result, the bar mirror 111 is thermally deformed. In addition, there is a concern that, as the length La of the elastic block 203 in the Y direction is increased, its rigidity is decreased and becomes more susceptible to the influence of vibration.

If a material having a linear expansion coefficient Km close to the linear expansion coefficient Kt of the material of the table 105 is used as the material of the bar mirror 111, in Equation 3, the magnitudes of Km and Kt are close to each other and the magnitudes of Lm and Lt are close to each other, and accordingly, the magnitude of La is small from Equation 1. That is, the length La of the elastic block 203 in the Y direction can be reduced, and the thermal deformation of the bar mirror 111 can be suppressed. Therefore, for the material of the bar mirror 111, it is preferable to use a material other than glass, such as ceramics, metal, or a composite material of metal and ceramics, and the like that has a linear expansion coefficient Km close to the linear expansion coefficient Kt of the material of the table 105.

FIG. 8B is a perspective view of a configuration in which the bar mirror 111 made of ceramics, metal, or a composite material of metal and ceramics is installed on the table 105. The table 103 is made of ceramics, metal, or a composite material of metal and ceramics. It the bar mirror 111 is made of a material having a linear expansion coefficient Km close to the linear expansion coefficient Kt of the material of the table 105, the length La of the elastic block 203 in the Y direction can be reduced as illustrated in FIG. 8B. As a result, the thermal resistance of the elastic block 203 can be reduced and heat can be easily conducted from the table 105 to the bar mirror 111 via the elastic block 203, such that the thermal deformation of the bar mirror 111 can be suppressed.

In addition, it is desirable that the bar mirror 111 is made of a material with a higher thermal conductivity than that of glass. If a material having a higher thermal conductivity than glass is used as the material of the bar mirror 111, the heat conduction of the bar mirror 111 is improved and the temperature difference between the bar mirror 111 and the table 105 in the transient state can be reduced, such that the thermal deformation of the bar mirror 111 can be suppressed, as compared to the case of using glass, which is a heat insulating material, for the material of the bar mirror 111.

For the bar mirror 111, any material can be used as long as it has a higher thermal conductivity than that of glass, and for example, ceramics, metal, or a composite material of metal and ceramic can be used. For example, if alumina ceramics is used as the material of the bar mirror 111, the thermal conductivity is improved by about 30 times as compared with the case of using silica glass as the material of the bar mirror 111. Glass has a low thermal conductivity such that it can be used as heat insulator. Therefore, using a material having a higher thermal conductivity than glass as the material of the bar mirror 111 is effective in suppressing the thermal deformation of the bar mirror 111.

As described above, by adapting, for the material of the bar mirror 111, at least one of the configuration using the material having the linear expansion coefficient Km close to the linear expansion coefficient Kt of the material of the table 105 and the configuration using the material having the higher thermal conductivity than glass, even in a transient state in which the temperature of the table 105 continues to rise, the balance of thermal expansion of the table 105, the elastic block 203, and the bar mirror 111 can be maintained, and the deformation of the bar mirror 111 can be suppressed, as illustrated in FIG. 8B.

FIG. 9 is a perspective view of part of the stage device according to the present embodiment. FIG. 9 illustrates the table 105, the bar mirror 111, the elastic block 203, and the chuck 108 provided in the stage device. For example, the table 105 is made of a composite material of metal and ceramics, and has a high thermal conductivity and a small thermal expansion coefficient. For example, the bar mirror 111 is made of surface-plated alumina ceramics. For example, the elastic block 203 is made of an aluminum alloy that has high thermal conductivity and is inexpensive. Bolts 901 are fixed between the table 105 and the elastic block 203 and between the elastic block 203 and the bar mirror 111, respectively.

If the vibration of the bar mirror 111 is increased during the movement of the table 105, the time to wait for the vibration to dampen after the movement of the table 105 is longer, resulting in reduced throughput. Furthermore, if the vibration characteristics of the bar mirrors 111 are different for each bar mirror 111, an element such as a low-pass filter, a notch filter, or the like that reduces the gain of the peak frequency of vibration is required in the positioning control system of the stage device. This factor causes an extra phase delay in the open-loop characteristic of the stage device, lowering the frequency at which the control system can respond. That is, since the settling time of the residual vibration is increased after the table 105 is moved, the throughput decreases.

In order to solve this problem, the stage device according to the present embodiment includes the elastic block 203 between the table 105 and the bar mirror 111, and the bolts 901 are fixed between the table 105 and the elastic block 203 and between the elastic block 203 and the bar mirror 111, such that it is possible to suppress the transmission of distortion and vibration, thereby achieving both a reduction in field of view positioning error and an improvement in throughput.

Moreover, if the bar mirror is made of a material other than glass, such as ceramics, metal, or a composite material of metal and ceramics, for example, it is possible to prevent the bar mirror 111 from being cracked by the bolt 901 tightening, thereby fixing the bar mirror 111 rigidly.

Further, by fixing with the bolt 901, the contact surfaces of the table 105, the elastic block 203 and the bar mirror 111 can be brought into close contact with each other by the axial force of the bolt 901. Therefore, as compared with the related structure in which the bar mirror 111 is fixed by pressing with a spring and the like, the contact thermal resistance can be lowered, and the heat of the table 105 can be easily transferred to the bar mirror 111, such that thermal deformation of the bar mirror 111 can be suppressed.

In addition, since the balance of thermal expansion of the table 105, the elastic block 203, and the bar mirror 111, including when in the transient state, is maintained, the shear force applied to the fastening portion of the bolt 901 is small, and deviation due to the difference in thermal expansion does not occur.

In the stage device according to the first to third embodiments of the present invention, since the field of view positioning error can be reduced, even before and after the temperature change of the table 105 and the bar mirror 111 and also in the transient state, the prepared correction map can be used, such that the positioning error of the stage (the table 105 can be reduced, and the pattern can be measured at the desired position of the wafer 106.

The correction of the stage positioning error in the stage device according to the embodiment of the present invention be described with reference to FIGS. 10A and 10B.

FIGS. 10A and 10B are views of the table 105 when viewed directly from above. The wafer 106, the bar mirror 111 extending in the Y direction, and the bar mirror 111 extending in the X direction are placed on the table 105. The elastic blocks 203 are installed between the table 105 and the bar mirror 111. FIG. 10A illustrates the table 105 before thermal expansion, and FIG. 10B illustrates the table 105 thermally expanded due to temperature change.

As illustrated in FIG. 10B, when the table 105 is thermally expanded due to temperature change, the distance between the bar mirror 111 and the wafer 106 is changed. However, in the stage device according to the embodiment of the present invention, the bending deformation of the bar mirror 111 in the X and Y directions is suppressed. Therefore, by measuring a relative distance 1001 between the bar mirror 111 and the wafer 106 and modifying the correction map by using the relative distance 1001 as an offset (modifying the amount of deviation of the image recorded in the correction map by using the relative distance 1001), the field of view deviation can be suppressed. For example, the relative distance 1001 can be obtained from the position in the field of view of the observation image, which is a reference, and the measured value of the laser interferometer 104.

The modification of the correction map by this offset is effective when the wafer 106 is placed on the table 105 or when it is considered that thermal expansion occurs in the table 105.

As described above, in the stage device according to the embodiment of the present invention, the field of view positioning error can be reduced and the positioning error of the stage (the table 105) can be reduced using the created correction map, such that the pattern can be measured at a desired position on the wafer 106 with high accuracy.

Note that the present invention is not limited to the embodiments described above, and various modifications are possible. For example, the embodiments described above are described in detail in order to explain the present disclosure in an easy-to-understand manner, and the present disclosure is not necessarily limited to aspects having all the configurations described above. Further, it is possible to replace a part of the configuration of one embodiment with the configuration of another embodiment. It is also possible to add the configuration of another embodiment to the configuration one embodiment. Moreover, it is possible to delete a part of the configuration of each embodiment, or to add or replace another configuration thereto.

REFERENCE SIGNS LIST

1: charged particle beam device
101: electron optical system lens barrel
103: drive mechanism
104: laser interferometer
105: table
105a
105b: steps of table
106: wafer
107: guide
108: chuck
109: controller
111: mirror
112: sample chamber
113: anti-vibration mount
115: optical axis of laser interferometer
203: elastic block
204: fixing portion
205: fixing portion
206: distance from reference point
207: distance between reflection surface of mirror and observation point
207a: distance between reflection surface of mirror and observation point when mirror is deformed
208: observation point obtained by correction map 209: observation point
901: bolt
1001: relative distance.

The invention claimed is:

1. A stage device comprising:
a table on which a sample is placed;
a bar mirror installed on the table;
a laser interferometer that irradiates the bar mirror with laser light and receives reflected light from the bar mirror, thereby measuring a position of the table;
a drive mechanism that moves the table; and
a plurality of block-shaped elastic members installed between the bar mirror and the table; and
wherein, a fixing portion between each elastic member and the table is a first fixing portion, and a fixing portion between each elastic member and the bar mirror is a second fixing portion, wherein a position of the first fixing portion and a position of the second fixing portion of each elastic member are different from each other in a length direction of the bar mirror.

2. The stage device according to claim 1, wherein the table includes two steps with different heights, and the plurality of elastic member is installed on an upper surface of a lower step.

3. The stage device according to claim 1, wherein the bar mirror is made of a material with a higher thermal conductivity than that of glass.

4. The stage device according to claim 1, wherein the bar mirror is formed using ceramics.

5. The stage device according to claim 1, wherein the bar mirror is formed using alumina ceramics.

6. A charged particle beam device comprising:
a sample chamber in which a sample is placed;
a lens barrel through which the sample is irradiated with a charged particle beam; and
a stage device that moves the sample, wherein the stage device is the stage device according to claim 1.

7. The stage device according to claim 1, wherein the plurality of elastic members is made of an aluminum alloy.

8. The stage device according to claim 1, wherein bolts are fixed between the table and the plurality of elastic members and between the plurality of elastic members and the bar mirror.

9. A stage device comprising:
a table on which a sample is placed;
a bar mirror installed on the table;
a laser interferometer that irradiates the bar mirror with laser light and receives reflected light from the bar mirror, thereby measuring a position of the table;
a drive mechanism that moves the table; and
a plurality of elastic members installed between the bar mirror and the table,
wherein, a fixing portion between each elastic member and the table is a first fixing portion, and a fixing portion between each elastic member and the bar mirror is a second fixing portion, wherein a position of the first fixing portion and a position of the second fixing portion of each elastic member are different from each other in a length direction of the bar mirror.

10. The stage device according to claim 9, wherein the table includes two steps with different heights, and the elastic member is installed on an upper surface of the lower step.

11. The stage device according to claim 9, wherein a distance between the first fixing portion and the second fixing portion of each of the plurality of elastic members in the length direction of the bar mirror is determined by using an interval between the first fixing portions of two adjacent elastic members, an interval between the second fixing portions of the two adjacent elastic members, a linear expansion coefficient of the table, a linear expansion coefficient of the bar mirror, and a linear expansion coefficient of the elastic member.

12. The stage device according to claim 9, wherein the bar mirror is made of a material with a higher thermal conductivity than that of glass, and wherein the bar mirror is formed using ceramics or alumina ceramics.

13. The stage device according to claim 9, wherein the elastic member includes first portion projecting toward the table at one end in a length direction of the bar mirror and second portion projecting toward the bar mirror at other end in the length direction of the bar mirror, and
wherein the elastic member is fixed with the table by the first portion at the first fixing portion and is fixed with the bar mirror by the second portion at the second fixing portion.

14. A stage device comprising:
a table on which a sample is placed;
a bar mirror installed on the table;
a laser interferometer that irradiates the bar mirror with laser light and receives reflected light from the bar mirror, thereby measuring a position of the table;
a drive mechanism that moves the table; and
a plurality of elastic members installed between the bar mirror and the table,
wherein, a fixing portion between each elastic member and the table is a first fixing portion, and a fixing portion between each elastic member and the bar mirror is a second fixing portion, wherein a position of the first fixing portion and a position of the second fixing portion of each elastic member are different from each other in a length direction of the bar mirror,
wherein only a lower surface of the bar mirror is fixed to the table with the plurality of elastic members being interposed therebetween.

15. The stage device according to claim 14, wherein the table includes at least two steps with different heights, and the plurality of elastic members is installed on an upper surface of the lower step.

16. The stage device according to claim 14, wherein the bar mirror is made of a material with a higher thermal conductivity than that of glass, and wherein the bar mirror is formed using ceramics or alumina ceramics.

17. The stage device according to claim 1, wherein the plurality of block-shaped elastic members are made of an elastic material comprising heat conductivity.

18. The stage device according to claim 1, wherein the plurality of block-shaped elastic member comprise a first portion projecting toward the table at one end in a length direction of the bar mirror and a second portion projecting toward the bar mirror at other end in the length direction of the bar mirror, and
wherein the plurality of block-shaped elastic member is fixed with the table by the first portion at the first fixing portion and is fixed with the bar mirror by the second portion at the second fixing portion.

19. The stage device according to claim 1, wherein the block-shaped elastic members suppress a transmission of deformation and distortion of the table to the bar mirror.

20. The stage device according to claim 1, wherein the plurality of block-shaped elastic member is installed at a height position of a middle plane of the table or in a vicinity of the height position of the middle plane.

\* \* \* \* \*